US006740158B2

(12) United States Patent
Piwczyk

(10) Patent No.: US 6,740,158 B2
(45) Date of Patent: May 25, 2004

(54) PROCESS FOR COATING SILICON SHOT WITH DOPANT FOR ADDITION OF DOPANT IN CRYSTAL GROWTH

(75) Inventor: Bernhard P. Piwczyk, Dunbarton, NH (US)

(73) Assignee: RWE Schott Solar Inc., Billerica, MA (US)

( * ) Notice: Subject to any disclaimer, the term of this patent is extended or adjusted under 35 U.S.C. 154(b) by 26 days.

(21) Appl. No.: 10/142,312

(22) Filed: May 9, 2002

(65) Prior Publication Data

US 2003/0209188 A1 Nov. 13, 2003

(51) Int. Cl.[7] ............................................... C30B 15/04
(52) U.S. Cl. ............................ 117/18; 117/13; 117/19; 117/23; 117/33; 117/932; 427/215; 427/220
(58) Field of Search ............................. 117/932, 13, 18, 117/19, 23, 33, 214; 427/215, 220

(56) References Cited

U.S. PATENT DOCUMENTS

| 3,615,943 A | | 10/1971 | Genser |
| 3,630,793 A | | 12/1971 | Christensen et al. |
| 3,914,138 A | * | 10/1975 | Rai-Choudhury |
| 4,201,622 A | * | 5/1980 | Salama ........................ 117/13 |
| 5,135,887 A | | 6/1992 | Delage et al. |
| 5,763,320 A | | 6/1998 | Stevens et al. |
| 6,008,110 A | * | 12/1999 | Samata et al. ............... 438/459 |
| 6,136,672 A | * | 10/2000 | Bourdelle et al. .......... 438/530 |
| 6,478,883 B1 | * | 11/2002 | Tamatsuka et al. ........... 117/20 |

FOREIGN PATENT DOCUMENTS

| EP | 035236 | * | 9/2000 |
| EP | 1138809 | * | 4/2001 |

* cited by examiner

Primary Examiner—Robert Kunemund
(74) Attorney, Agent, or Firm—Pandiscio & Pandiscio

(57) ABSTRACT

An inexpensive method of coating silicon shot with boron atoms comprises (1) immersing silicon shot in a boron dopant spin-on solution comprising a borosilicate, a polymer precursor, and a volatile solvent, and (2) removing the solvent so as to leave a polymeric coating containing borosilicate on the shot. A precise amount of this coated shot may then be mixed with a measured quantity of silicon pellets and the resulting mixture may then be melted to provide a boron-doped silicon melt for use in growing p-type silicon bodies that can be converted to substrates for photovoltaic solar cells.

12 Claims, No Drawings

PROCESS FOR COATING SILICON SHOT WITH DOPANT FOR ADDITION OF DOPANT IN CRYSTAL GROWTH

This invention was made under DOE Subcontract No. ZAX-8-17647-10.

FIELD OF THE INVENTION

This invention relates to growing crystalline bodies of silicon from a melt by the Edge-Defined Film-Fed Growth (EFG) Process, and more particularly to the provision of a selected dopant in a melt of silicon.

BACKGROUND OF THE INVENTION

The EFG process is well known, as evidenced by the following U.S. Pat. Nos. 4,230,674; 4,661,324; 4,647,437; 4,968,380; 5,037,622; 5,098,229; 5,106,763; 5,156,978; and 5,558,712. In the EFG process, crystalline bodies having a predetermined cross-sectional shape, e.g., tubes of octagonal cross-section, are grown on a seed from the liquid film of a selected material which is transported by capillary action from a melt contained in a crucible to the top end surface of an EFG die. In order to grow relatively large tubes, e.g., tubes of octagonal cross-sectional shape measuring 4–6 inches on each flat side and 15–20 feet in length, it is necessary to replenish the melt during the growth process, with the replenishment being conducted so as to keep the level of the molten silicon substantially constant in the crucible containing the melt. The silicon feedstock used in growing silicon tubes is typically in the form of substantially spherical pellets ("shot") having a diameter in the order of 2 mm. The common practice is to deliver additional feedstock to the crucible on an intermittent basis according to the rate of consumption of the melt, so as to maintain the level of the melt in the crucible within predetermined limits.

The EFG process has been used extensively to grow silicon tubes, e.g., tubes of octagonal and nonagonal shape, and those tubes are subdivided by cutting out square or rectangular wafers from their flat sides. Those wafers are then used as substrates to form individual photovoltaic cells. U.S. Pat. Nos. 4,751,191, 5,106,763, 5,270,248 and 5,320,684 illustrate methods used to manufacture silicon solar cells from wafers cut out of EFG-grown tubes.

The EFG wafers used for making solar cells are p-type silicon having a resistivity between 3–5 ohm-cm. Heretofore the p-type conductivity and desired resistivity is the result of introducing boron dopant to the melt. The ratio of silicon to dopant atoms is normally very large, approximately eight orders of magnitude. This requires careful control of quantity and method of introduction of dopant into the silicon melt. Heretofore the doping of the melt has been achieved by adding a small, carefully measured, amount of silicon shot highly doped with boron to a predetermined quantity of intrinsic (pure) silicon feedstock (also in the form of shot), with the amount of highly doped silicon shot being set to achieve the doping level required to grow tubes of desired resistivity. The mixture of doped silicon shot and pure silicon feedstock is intermixed and dissolved to form a melt, with the boron in the doped silicon shot being dissolved uniformly throughout the melt.

A problem with the tube-growing process as practiced prior to this invention is that the highly doped silicon shot is expensive and difficult to obtain. For these reasons, an alternative and inexpensive method of providing boron-doped silicon shot has been needed.

OBJECTS AND SUMMARY OF THE INVENTION

The primary object of the invention is to provide a method of adding boron to silicon shot, thereby providing silicon shot which can be intermixed and melted with a silicon feedstock to provide a silicon melt having a doping level calculated to assure growth of shaped crystalline bodies with a desired resistivity.

A further object of the invention is to provide an inexpensive and easy to execute method of coating silicon shot with dopant atoms.

Still another object is to provide an improved method of doping a silicon melt with boron.

A more specific object is to provide coated silicon pellets consisting of a relatively large core of intrinsic silicon and a relatively thin outer layer of a boron-containing organic polymer layer.

These and objects of the invention are achieved by a method comprising the steps of (1) immersing silicon shot (pellets) in a spin-on dopant solution that consists essentially of a borosilicate in a volatile solvent, plus a polymer precursor, and (2) removing the solvent so as to leave a polymeric coating or film containing boron on the shot. These coated pellets are intermixed and melted with a measured quantity of intrinsic (pure) silicon pellets to provide a boron-doped silicon melt for use in growing silicon tubes that can be subdivided to provide substrates for use in producing photovoltaic cells.

DETAILED DESCRIPTION OF THE INVENTION

As noted above, the quantity of boron dopant in the silicon melt must be carefully controlled so as to match the resistivity requirements of the finished crystal and the dopant must be uniformly distributed throughout the finished crystal. These requirements are met by the present invention.

The method of the present invention involves coating a quantity of intrinsic silicon pellets (shot) of nearly uniform size With a borosilicate-containing coating, so that the resulting silicon pellets consist of a relatively large core of intrinsic silicon and a relatively thin layer containing boron. The borosilicate-containing coating is produced by immersing intrinsic silicon shot in a borosilicate spin-on solution. Dilute solutions of a selected borosilicate in a volatile solvent, typically an alcohol such as propanol, are available commercially as spin-on dopant solutions for use in the semiconductor industry. Such spin-on dopant solutions also include one or more polymer precursors, i.e., one or more selected monomers.

The method of this invention is straightforward and requires no specially-made equipment. A precisely measured amount of previously cleaned intrinsic silicon shot is placed in a clean container and an accurately measured amount of a borosilicate-containing spin-on dopant is added. The amount of boron in the spin-on solution and the weight of the intrinsic silicon shot are calculated such that the weight of boron and the weight of silicon are in a specific ratio. Additional volatile solvent may be added to assure that all of the silicon shot is covered by the solvent. The contents of the container are mixed by stirring, gentle shaking or rotation to assure uniform distribution of the borosilicate dopant. Then the contents of the container are heated so as to cause the volatile solvent to be evaporated slowly. The heating and stirring are continued until all of the solvent has been evaporated and the silicon shot is dry and moves freely. At this point, the particles of silicon shot are characterized by a uniform polymeric coating containing the borosilicate. The evaporation process is carried out at the boiling point of the solvent, which necessarily must be less than the temperature at which the borosilicate undergoes any change. Hence no boron is lost during the evaporation process. Water may be liberated during the polymerization reaction. Accordingly during the evaporation step the temperature is increased slightly above 212° F. to assure removal of water. With the removal of water, the process is complete and the resulting borosilicate-coated shot may now be used as a source of boron dopant for a silicon melt.

Doping of a silicon melt using the boron-coated shot is accomplished by weighing a precise amount of the coated shot and adding that to a measured quantity of a silicon feedstock in pellet form, and then thoroughly mixing the two to achieve a uniform distribution of coated shot throughout the mass of uncoated feedstock. The ratio of coated shot to the silicon feedstock is measured such that the concentration of boron is at the level required to achieve a desired resistivity in the grown crystal. Preferably the concentration is set to provide a resistivity of between 3 and 5 ohm-cm. However, the amount of dopant added to the intrinsic silicon may be set to provide a different resistivity, e.g., a resistivity of 1 ohm-cm. The resulting mixture is then used as the feedstock for growing EFG tubes for use as a source of solar cell substrates.

The growth of EFG silicon tubes is on a batch basis, with each tube being grown to a particular length determined by the growth apparatus and the amount of doped silicon feedstock supplied to the crucible. Typically the amount of feedstock supplied for growing a single silicon tube is 3.0 kilograms. Since the ratio of silicon to dopant atoms is normally very large, approximately eight orders of magnitude, the amount of doped silicon shot required to be added to a 3.0 kilogram supply of silicon feedstock is small. Accordingly, for reasons of efficiency and cost, the quantity of silicon pellets that are subjected to the coating process of this invention is relatively large, enough to satisfy the dopant needs of many batches of silicon feedstock.

Following is a specific example of how to practice the invention. In this example, the spin-on solution is a dilute solution of a borosilicate in an alcohol produced by Filmtronics Semiconductor Process Materials, P.O. Box 1521, Butler, Pa. 16003, as Product No. B219. That spin-on solution contains a polymer precursor and the solvent is believed to be propanol. The solution has a specific gravity of 0.8 g and contains $0.69*10^{-2}$ wt % of boron. The amount of boron in 1 cm$^3$ of that spin-on solution is 5.52 mg. The amount of coated silicon shot that is produced in this specific example is what is required to dope a 3.0 kg batch of silicon shot so as to grow silicon tubes with a resistivity of about 3 ohm-cm. In order to satisfy that resistivity requirement, it has been calculated that the amount of boron required to be added to a 3.0 kg supply of intrinsic silicon shot is 0.10537 mg. However, since not all of the boron in a grown crystalline tube is electronically active and because some of the boron may remain on the walls of the process vessel, it is preferred to increase the amount of boron by 20%. Therefore, the amount of boron that is added to the 3.0 kg supply of intrinsic silicon shot is increased to $1.2*0.10537$ mg=0.12644 mg. Based on the concentration of boron in the spin-on dopant solution, it has been calculated that, for growing tubes with a resistivity of about 3 hm-cm, the volume of spin-on dopant solution required for doping a 3.0 kg batch of silicon shot is 57 cm3. The quantity of coated silicon shot to be added to each to each 3.0 kg charge of intrinsic silicon feedstock is 1.5 grams.

The silicon pellets or shot to be coated have an average diameter of approximately 0.6 mm, a volume of approximately 0.1165 mm$^3$, and an average weight of 0.271 mg. Therefore, one gram of the silicon shot to be coated contains approximately 4000 pellets. The large number of pellets assures uniform distribution of boron dopant in the charge of intrinsic silicon feedstock.

EXAMPLE

In this example, 3.0 kg of previously cleaned intrinsic silicon shot to be coated characterized by an average diameter of approximately 0.6 mm and 57 cm$^3$ of the B219 borosilicate-containing spin-on dopant solution are placed in a clean container. Methanol is added as required to fully cover all of the silicon shot. The contents of the container are then mixed by a gentle stirring. The container is then immersed in an oil bath that is at a temperature that is just to evaporate the solvent content of the B219 solution and the methanol. After the alcohol has evaporated, the temperature is raised to a level just sufficient to evaporate any water present. The heating is discontinued after the water has been removed and the silicon shot is dry and moves freely. The result is a quantity of silicon shot having a uniform polymeric coating containing borosilicate. It is believed that the polymeric coating is confined substantially to the surfaces of the silicon shot.

This coated shot is then added to 3.0 kg batches of intrinsic silicon feedstock in pellet form so as to achieve a uniform distribution of coated shot among the feedstock pellets, with 1.5 grams of coated silicon shot being added to each batch of undoped feedstock. As noted above, the intrinsic silicon pellets to be coated have an average diameter of about 0.6 mm. The intrinsic silicon pellets preferred to be used as feedstock have an average diameter of about 2.0 mm. Based on the foregoing, the resulting mixture will have approximately 1 doped pellet for about every 5000 undoped pellets. This insures that the boron dopant is evenly distributed throughout the feedstock if adequate mixing is performed. Further each such batch of silicon pellets has a concentration of boron that will result in a resistivity of approximately 3 ohm-cm in tubes grown from a melt of those pellets.

The foregoing process is simple and relatively inexpensive and has the further advantage of being conducted with relatively inexpensive equipment. The added methanol is preferably of semiconductor grade.

Although the invention has been described as using a specific spin-on dopant solution, it is to be understood that a different boron-containing solution may be used in practicing the invention, e.g., one containing a different borosilicate or volatile solvent. Further the specific polymer precursor present in the solution used is not critical, provided that it be capable of forming a polymeric coating containing the boron dopant when the solution is heated to remove the volatile solvent.

The amount of spin-on dopant solution used for coating silicon pellets and the amount of silicon pellets to be coated for each batch of feedstock to be doped may vary as required to obtain the desired boron concentration in the melt formed by heating a mixture of coated silicon pellets and feedstock intrinsic silicon pellets. Also the size of the silicon pellets to be coated and the size of the intrinsic silicon pellets used as feedstock for the melt may be other than as set forth in the foregoing specific example. The particular method used to impart movement to the silicon pellets/spin-on dopant solution contents of the container in which that mixture is heated also may be varied, as long as it prevents agglomeration of the coated pellets and does not impede solvent removal by evaporation. Still other modifications will be obvious to persons skilled in the art from the foregoing detailed description.

What is claimed is:

1. Method of coating silicon pellets with boron dopant for use in adding dopant to a silicon melt comprising the steps of:
    combining a measured quantity of clean silicon pellets with a solution comprising a borosilicate, a polymer precursor and a volatile solvent so as to form a mixture thereof;
    heating said mixture to a temperature at which the solvent evaporates but at which the borosilicate is substantially unaffected; and
    evaporating the solvent completely whereby a polymeric coating containing the borosilicate coating is formed on the surfaces of the pellets.

2. Method according to claim 1 wherein the pellets are subjected to continued movement in the mixture while the solvent is being evaporated.

3. Method according to claim 1 wherein said solvent is an alcohol.

4. Method according to claim 3 wherein said solvent is propanol.

5. Method according to claim 1 wherein said pellets have an average diameter of about 0.6 mm.

6. Method of adding boron dopant to a silicon feedstock comprising adding a predetermined amount of borosilicate-coated silicon pellets produced according to the method of claim 1 to a predetermined quantity of intrinsic silicon pellets, and mixing said coated and intrinsic silicon pellets so that said coated pellets are dispersed uniformly throughout said quantity of intrinsic silicon pellets.

7. Method of claim 6 wherein said predetermined amount of coated pellets and said predetermined quantity of intrinsic silicon pellets are such as to provide a concentration of boron that will provide a resistivity of approximately 3 to 5 ohm-cm in silicon bodies that are grown from a melt formed by melting said coated and intrinsic silicon pellets.

8. Method according to claim 6 wherein said coated pellets have an average diameter of 0.6 mm and said intrinsic silicon pellets have an average diameter of about 2.0 mm.

9. Method of coating silicon shot with boron dopant for use in adding dopant to a silicon melt comprising the steps of:
    combining in a container (1) a spin-on dopant solution comprising a borosilicate and (2) a measured quantity of clean silicon pellets so as to form a mixture thereof;
    heating said mixture to a temperature at which a solid borosilicate-containing coating is formed on the pellets;
    moving the pellets as they are being heated so as to prevent agglomeration thereof; and
    terminating the heating after the solution has been fully evaporated and the pellets are dry and free moving.

10. Method according to claim 9 wherein said spin-on dopant solution comprises an alcohol and a polymer precursor.

11. Method according to claim 10 wherein said solution comprises propanol or methanol.

12. Method according to claim 9 wherein said silicon shot has an average diameter of about 0.6 mm.

* * * * *